(12) United States Patent
Meyer

(10) Patent No.: US 11,387,539 B2
(45) Date of Patent: Jul. 12, 2022

(54) ANTENNA SYSTEM, COMMUNICATION SYSTEM, METHOD

(71) Applicant: XILINX, INC., San Jose, CA (US)

(72) Inventor: Peter Meyer, Dresden (DE)

(73) Assignee: XILINX, INC., San Jose, CA (US)

( * ) Notice: Subject to any disclaimer, the term of this patent is extended or adjusted under 35 U.S.C. 154(b) by 94 days.

(21) Appl. No.: 17/051,854

(22) PCT Filed: May 2, 2019

(86) PCT No.: PCT/EP2019/061199
§ 371 (c)(1),
(2) Date: Oct. 30, 2020

(87) PCT Pub. No.: WO2019/211359
PCT Pub. Date: Nov. 7, 2019

(65) Prior Publication Data
US 2021/0119317 A1    Apr. 22, 2021

(30) Foreign Application Priority Data

May 2, 2018   (EP) .................................... 18170297

(51) Int. Cl.
*H01Q 1/12*  (2006.01)
*H01Q 1/02*  (2006.01)
*H01Q 1/24*  (2006.01)
*H05K 7/20*  (2006.01)

(52) U.S. Cl.
CPC ............ *H01Q 1/1228* (2013.01); *H01Q 1/02* (2013.01); *H01Q 1/246* (2013.01); *H05K 7/20418* (2013.01)

(58) Field of Classification Search
CPC .......... H01Q 1/12; H01Q 1/1228; H01Q 1/02; H01Q 1/246
See application file for complete search history.

(56) References Cited

U.S. PATENT DOCUMENTS

2016/0261030 A1    9/2016   Kim et al.

FOREIGN PATENT DOCUMENTS

| WO | 2011002116 A1 | 1/2011 | |
| WO | WO-2013064091 A  * | 5/2013 | ............. H01Q 1/246 |
| WO | 2013191800 A1 | 12/2013 | |

OTHER PUBLICATIONS

International Search Report and Written Opinion for PCT/EP2019/061199 dated Jul. 26, 2019.

* cited by examiner

*Primary Examiner* — Hoang V Nguyen
(74) *Attorney, Agent, or Firm* — Patterson + Sheridan, LLP

(57) ABSTRACT

The present invention provides an antenna system (100, 200, 211, 300, 400, 500, 600) for attachment to an antenna pole (250, 350), the antenna system (100, 200, 211, 300, 400, 500, 600) comprising a cooling arrangement (101, 201, 212, 301, 401, 501, 601), an active electronic arrangement (102, 202, 213, 302, 402, 502, 602) that comprises a number of antenna elements (103, 104) and a number of receivers and/or transmitters for the antenna elements (103, 104), wherein the active electronic arrangement (102, 202, 213, 302, 402, 502, 602) is releasably attachable to the cooling arrangement (101, 201, 212, 301, 401, 501, 601). Further, the present invention provides a communication system (210) and a method for manufacturing an antenna system (100, 200, 211, 300, 400, 500, 600).

20 Claims, 7 Drawing Sheets

ANTENNA SYSTEM, COMMUNICATION SYSTEM, METHOD

TECHNICAL FIELD

The invention relates to an antenna system for attachment to an antenna pole, a respective communication system and a method for manufacturing an antenna system.

BACKGROUND

Although applicable to any type of antenna, the present invention will mainly be described in conjunction with massive MIMO antennas.

Today wireless communication networks are widely used for providing voice and data communication to users. Such wireless communication networks, like e.g. LTE based or so called 4G networks, usually comprise a core network and a so called radio access network or RAN. It is understood, that each of these interrelated networks may comprise a plurality of different elements, modules or units that together provide the required communication capabilities.

As part of the RAN so called eNodeBs or base stations provide the link between the operators network and the users mobile devices or user equipments (UEs). Usually the eNodeBs will comprise antennas that serve for transmitting outgoing signals to the UEs and for receiving incoming signals from the UEs. Up to now, most commonly passive or active antennas with fixed radiation patterns are used.

However, in modern 5G-Networks such conventional antennas may be replaced by massive MIMO antennas (antennas with a plurality of single antenna elements that may form and steer a plurality of beams at the same time). Such massive MIMO antennas usually require a single transceiver, e.g. a combination of a transmitter and a receiver, for every antenna element.

If the electronic part, i.e. the transceiver, is provided ground-based (i.e. not on the antenna pole) a single cable has to be provided from every one of the transceivers to the respective antenna element(s).

However, including the electronic part in the antenna on the pole drastically increases the weight of the respective antenna. An increasing weight of an active antenna poses a technical problems and is a big cost factor for the network operators. For example, antennas must be attached to an antenna pole on a tower or on a roof top of a high building. This requires skilled workers. If an antenna has a weight of e.g. less than 25 kg, it is relatively easy to attach it to the antenna pole by one or two craftsmen using an aerial work platform. However, if the weight is around 50 kg, an additional crane is required to lift the antenna and hold it in the right position during mounting. This is leading to significant cost and organizational effort. In most cases, also the public area e.g. a street must be blocked during the time of mounting.

Accordingly, there is a need for providing an improved antenna design with reduced mounting effort.

SUMMARY OF THE INVENTION

The above stated problem is solved by the features of the independent claims. It is understood, that independent claims of a claim category may be formed in analogy to the dependent claims of another claim category.

Accordingly, it is provided:

An antenna system for attachment to an antenna pole, the antenna system comprising a cooling arrangement, and an active electronic arrangement that comprises a number, i.e. one or more, of antenna elements and a number, i.e. one or more, of receivers and/or transmitters for the antenna elements, wherein the active electronic arrangement is releasably attachable to the cooling arrangement.

Further, it is provided:

A communication system for wireless communication, the communication system comprising a baseband processor, and a number, i.e. one or more, of antenna systems according to the present invention, wherein the antenna systems are coupled to the baseband processor.

Further, it is provided:

A method for manufacturing an antenna system according to the present invention, the method comprising forming a cooling arrangement configured to dissipate heat, and providing an active electronic arrangement that comprises a number of antenna elements and a number of receivers and/or transmitters, e.g. combined in transceivers, for the antenna elements, wherein the active electronic arrangement is provided such that it is releasably attachable to the cooling arrangement.

The present invention is based on the finding, that providing the electronics of an antenna system, i.e. the transceivers and interfacing elements, in a single housing with the cooling arrangement, leads to high cabling effort (one cable per transceiver) and increases the weight of the combined electronic/cooling arrangement to a level that makes it difficult to handle the combined electronic/cooling arrangement.

Especially for massive MIMO antennas the weight of the heat-sink may be in the range of 15 kg-20 kg. If the electronics part is added, the weight may easily increase up to 30 kg or 40 kg or more.

Therefore, the present invention proposes to combine all active electronic parts with the passive antenna elements in the active electronic arrangement. In addition, a dedicated cooling arrangement, e.g. comprising a passive heat sink, is provided.

The active electronic arrangement may be releasably attached to the cooling arrangement. It is understood, that the receivers and transmitters may be provided as integrated transceivers, and that any number of receivers, transmitters or transceivers may be provided. Further, transceivers may be provided as integrated modules, e.g. comprising further signal processing functions and mechanically carrying the respective antenna elements. Such an arrangement allows providing a very flexible design that may form an active or massive MIMO antenna. Further, it is understood, that the active electronic arrangement may also comprise other electronic units or elements that may e.g. be provided with active or massive MIMO antennas. Such electronic units may e.g. comprise a signal processing device or control unit. Such a unit may e.g. provide a digital IQ-interface to a baseband processor of the respective base station or eNodeB, perform e.g. beamforming and calibration functions, and couple to the transceivers to perform transmission and reception of RF signals. In this case, the active electronic arrangement may comprise a single digital CPRI interface to the baseband processor and a power supply interface.

This allows separately mounting the active electronic arrangement and the cooling arrangement to an antenna pole. For example, either one of the two arrangements may be mounted to the antenna pole. The other arrangement may then be mounted to the antenna pole or the first mounted arrangement in a second step.

If for example a complete active or massive MIMO antenna weights around 40 kg, it can be assumed that the cooling arrangement will weigh about 20 kg and the active electronic arrangement will also weigh about 20 kg. The present invention allows mounting such an antenna in two steps, each step requiring only the mounting of a 20 kg arrangement.

The present invention therefore makes it easy to attach a heavy antenna, like e.g. an active or massive MIMO antenna to an antenna pole.

At the same time, the present invention drastically reduces the cabling effort as compared to antennas with a combined electronic/cooling arrangement, since no dedicated cabling has to be provided between the combined electronic/cooling arrangement and the antenna elements in the other part of the antenna. Instead, the transceivers may be directly coupled to the respective antenna element(s) within the active electronic arrangement, e.g. via traces and connectors or via cables that may be mounted during production of the active electronic arrangement.

Further embodiments of the present invention are subject of the further subclaims and of the following description, referring to the drawings.

In an embodiment, the active electronic arrangement or the cooling arrangement may be configured for mounting to the antenna pole.

If one of the two arrangements that form the antenna system may be mounted to the antenna pole directly or via mounting brackets or retainers, mounting the complete antenna system becomes very simple.

For example, the active electronic arrangement may comprise mounting brackets or a recess that accommodate the antenna pole. It is understood, that any type of clamp, screw-based fixation or the like may be used to couple the active electronic arrangement to the antenna pole. After mounting the active electronic arrangement, the cooling arrangement can then easily be mounted on the already installed active electronic arrangement.

As alternative, the cooling arrangement may be mounted first to the antenna pole. Again, it is understood, that any type of mechanical fixation may be used to couple the cooling arrangement to the antenna pole. In a second step the active electronic arrangement with the electronic elements and the antenna elements may be attached to the cooling arrangement.

In an embodiment, either the active electronic arrangement or the cooling arrangement may e.g. comprise a recess in the form of the antenna pole, e.g. a half-cylindrical recess that may accommodate the antenna pole upon mounting of the respective arrangement to the antenna pole. It is further understood, that the antenna pole may e.g. comprise protrusions that may engage with specific recesses in the respective arrangement or vice versa. Such an engagement will form a kind of bearing that absorbs the gravitational force that acts on the respective one of the arrangements.

In a further embodiment, a mounting bracket may be pre-mounted to the antenna pole prior to mounting the cooling arrangement or the active electronic arrangement. The mounting bracket may then accommodate the cooling arrangement or the active electronic arrangement.

The coupling between the active electronic arrangement and the cooling arrangement is preferably performed in a way that provides a close thermal connection between the cooling arrangement and the active electronic arrangement.

The two-step mounting of the antenna system is advantageous in that for example the cooling arrangement, that is not so sensitive to mechanical stress, may be mounted first to the antenna pole. After mounting the mechanically non-sensitive cooling arrangement, the active electronic arrangement may then be attached to the cooling arrangement with little mechanical stress, since the main mechanical connection to the antenna pole exists between the cooling arrangement and the antenna pole.

Further, especially if the cooling arrangement is the part that is fixed to the antenna pole, it is also easily possible to replace the active electronic arrangement without removing the cooling arrangement from the pole. Therefore, in the case of a defect of the electronics of the antenna system or in case of an upgrade of the antenna system to a newer electronics generation, it is not necessary to completely remove the antenna system. Instead, the cooling arrangement may be kept on the antenna pole.

In a further embodiment, the active electronic arrangement may comprise a housing, wherein the housing may comprise a radome that covers the antenna elements at least in main transmission and reception direction, and a heat spreader that is coupled to the receivers and/or transmitters.

The housing provides a complete closure of all RF and/or electronic elements of the antenna system with the radome at least in the front of the antenna system. It is understood, that the radome may also extend to the sides, the top and the bottom of the housing. The radome may therefore e.g. comprise a cover that covers a half-sphere. Further, a mounting frame or a mounting back cover may be provided. This frame or back cover may comprise, especially on the bottom side, connectors for connecting the antenna system to a power supply and e.g. a base station, especially a baseband processor of the base station.

For providing the above mentioned close thermal connection between the cooling arrangement and the active electronic arrangement, the back of the frame or back cover may comprise a smooth metallic area that provides good heat transfer characteristics. Inside of the housing all heat generating elements may be thermally connected to the frame or back cover. The term "thermally connected" refers to any type of connection that allows transferring heat from the respective active electronic element to the frame or back cover. Such a connection may be provided e.g. by providing the frame or back cover with a flat surface and pressing the respective electronic element onto this surface. It is understood, that the electronic element may e.g. be provided with a dedicated housing, like a module inside of the active electronic arrangement, that may also provide such a flat surface for contacting the flat surface of the frame or back cover. It is understood, that e.g. thermal paste or thermal pads may be provided between the two flat surfaces. It is understood, that other heat transfer arrangements, like e.g. heat pipes or the like may also be used.

In a further embodiment, the housing may comprise a fixation element for releasably fixing the active electronic arrangement on its back upper edge to the front upper edge of the cooling arrangement, wherein the cooling arrangement may comprise a counterpart for the fixation element on the front upper edge. In alternative embodiments, the fixation element may be arranged on any side or edge of the housing and the counterpart may be arranged accordingly on the cooling arrangement. For example, the fixation element and the counterpart may be provided on the respective lower edges. This allows attaching the active electronic arrangement from the top into the cooling arrangement and resting the active electronic arrangement via the fixation element. The active electronic arrangement may then be tilted towards the cooling arrangement and e.g. be fixed with screws.

The fixation element and its counterpart on the respective top edges may serve as a kind of hinge or hook that allows plugging or hanging the active electronic arrangement on the cooling arrangement. Therefore, when mounting the antenna system to an antenna pole, the cooling arrangement may be mounted to the antenna pole first. The active electronic arrangement may then be mounted to the cooling arrangement by simply plugging or hanging it onto the cooling arrangement.

It is understood, that further fixation e.g. with screws, clips or snap-fits may also be performed. However, such a fixation would not need to bear the weight of the active electronic arrangement. Instead the additional fixation only needs to make sure that the fixation element does not come loose of the cooling arrangement.

In another embodiment, the housing may comprise a number of downwards inclined protrusions, and the cooling arrangement may comprise corresponding recesses that are configured to accommodate the downwards inclined protrusions. As alternative, the cooling arrangement may comprise a number of upward inclined protrusions, and the active electronic arrangement may comprise corresponding recesses that are configured to accommodate the upward inclined protrusions.

The inclined protrusions, e.g. bolts or spikes, may engage with the respective recesses. The inclination of the protrusions leads to the downward force that acts on the active electronic arrangement pushing the active electronic arrangement onto the cooling arrangement. The more the active electronic arrangement is pulled downwards, the stronger the force that pushes or pulls the active electronic arrangement to the cooling arrangement will be.

In addition, the inclined protrusions will serve as a fixation as long as the active electronic arrangement is not moved upwards with respect to the cooling arrangement. Therefore, a simple screw, snap-in element or clip that secures the active electronic arrangement against an upward movement may be sufficient to provide a secure mounting of the active electronic arrangement to the cooling arrangement.

In a further embodiment, a heat transfer support element may be provided between the active electronic arrangement and the cooling arrangement.

The heat transfer support element may e.g. be a thermal paste or a thermal pad. In case of thermal paste, this paste may e.g. be spread on the respective surface of the cooling arrangement or the active electronic arrangement prior to coupling the active electronic arrangement to the cooling arrangement, e.g. during production.

A thermal pad may e.g. be provided pre-fixed either on the respective surface of the cooling arrangement or the active electronic arrangement. Such a pre-fixed thermal pad may e.g. be protected with a foil that must be removed prior to mounting.

In another embodiment, the cooling arrangement may comprise a plurality of heat dissipation fins and/or a number of active cooling elements and/or a number of liquid-based cooling elements.

It is understood, that different kinds of cooling arrangements can be used in the antenna system. Such cooling arrangements may easily be adapted to different surroundings and environmental conditions. Therefore, for example the size and number of the fins may be adapted according to the amount of heat that must be dissipated in the respective location. If passive cooling with fins is not sufficient, the present invention also allows providing active cooling elements, like e.g. fans or the like or liquid-based cooling elements with the cooling arrangement.

It is therefore easily possible to adapt the cooling arrangement e.g. for different climate zones. For cold areas, smaller fins are sufficient for cooling the antenna while in extremely hot areas large fins may be required, eventually with active cooling elements.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
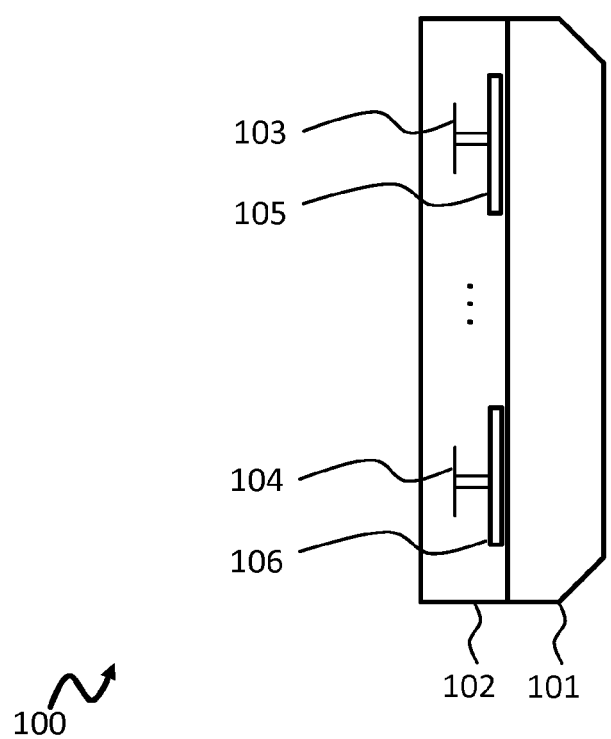
FIG. 1 shows a schematic diagram of an embodiment of an antenna system according to the present invention.

FIG. 1 shows a schematic diagram of an antenna system 100. The antenna system 100 comprises a cooling arrangement 101 and an active electronic arrangement 102 that comprises a number of antenna elements 103, 104 and a number of receivers and/or transmitters, here in the form of transceivers 105, 106, for the antenna elements 103, 104.

The active electronic arrangement 102 is releasably attached to the cooling arrangement 101. This means that the cooling arrangement 101 and the active electronic arrangement 102 are not one single element. Instead, whenever required, the active electronic arrangement 102 may be detached from the cooling arrangement 101.

The antenna system 100 by including the required electronics and RF elements, i.e. the transceivers 105, 106 and the antenna elements 103, 104, in the active electronic arrangement 102, may be advantageously mounted and serviced.

For mounting the antenna system 100, the cooling arrangement 101 and the active electronic arrangement 102 may be separated. For example, the cooling arrangement 101 may be mounted first. The active electronic arrangement 102 may then be attached to the already mounted cooling arrangement 101. In another embodiment, the active electronic arrangement 102 may be mounted first e.g. to an antenna pole.

It is understood, that any type of mounting or fixation may be used to fix the respective one of the arrangements 101, 102 to the antenna pole. Below clamps will be shown. However, direct mounting via a respectively formed recess in the respective one of the arrangements 101, 102 or any other arrangement may also be used.

The active electronic arrangement 102 comprises the transceivers 105, 106 as combined receivers and transmitters. It is understood, that although only two transceivers 105, 106 are shown, any other number of transceivers may also be provided. Especially if the antenna system 100 is a so called active or massive MIMO antenna system 100, a larger number of transceivers, e.g. eight 16 or more may be provided.

Figure 2:
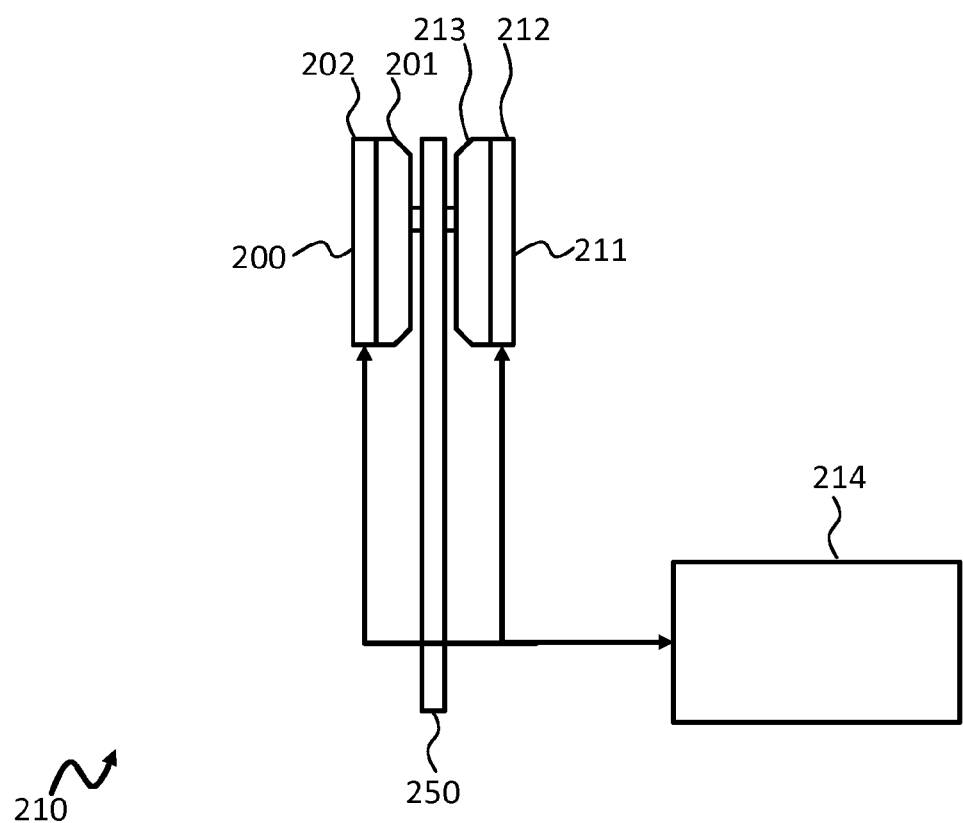
FIG. 2 shows a schematic diagram of an embodiment of a communication system according to the present invention.

FIG. 2 shows a schematic diagram of a communication system 210. The communication system 210 comprises two exemplary antenna systems 200, 211 according to the present invention. Only one and more than the two shown antenna systems 200, 211 are also possible. The antenna systems 200, 211 are both coupled to a baseband processor 214.

It is understood, that the baseband processor 214 may comprise e.g. a power supply for the antenna systems 200, 211 as well as a processor or digital logic for processing baseband signals, especially digital baseband signals, e.g. IQ signals, that may be provided to or received from the antenna systems 200, 211 via a CPRI interface or any other digital data interface.

It is however also understood, the baseband processor 214 in one embodiment may also be a reduced functionality baseband processor 214. Such a reduced functionality baseband processor 214 may e.g. provide a power supply to the antenna systems 200, 211 and may communicate the single antenna systems 200, 211 to a backbone or core network of the respective operator. The logic or functions of traditional baseband processors may in that case be provided by logic elements or processors in the antenna systems 200, 211.

Figure 3:
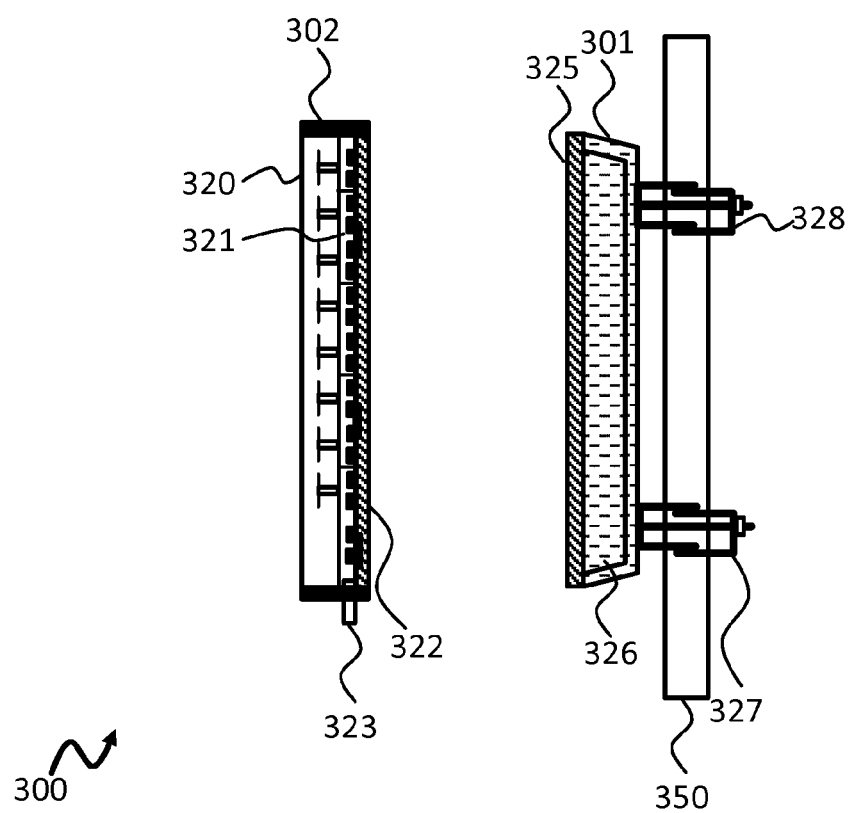
FIG. 3 shows a schematic diagram of another embodiment of an antenna system according to the present invention.

FIG. 3 shows a schematic diagram of an antenna system 300. The antenna system 300 also comprises a cooling arrangement 301 and an active electronic arrangement 302. In contrast to the antenna system 100, the antenna system 300 is shown with the cooling arrangement 301 separated from the active electronic arrangement 302. In addition, the cooling arrangement 301 is fixed to an antenna pole 350 via clamps 327, 328, such that the antenna pole is positioned on the back side of the cooling arrangement 301.

The cooling arrangement 301 comprises a contact surface 325 for contacting the active electronic arrangement 302 on the front, on the back the cooling arrangement 301 comprises a plurality of heat dissipation fins 326. In the side view the exact number of heat dissipation fins 326 may not be seen. However it is understood, that any adequate number of heat dissipation fins may be used. Depending on the climate at the spot, where the antenna system 300 is installed, the number, size and dimension of the heat dissipation fins 326 may be adjusted accordingly.

The contact surface 325 and the heat dissipation fins 326 may be made of a single piece of material, e.g. aluminum or the like. As an alternative, the contact surface 325 and the heat dissipation fins 326 may each be formed of a single piece of the respective material. The single pieces may e.g. be joined during production or manufacturing.

The active electronic arrangement 302 comprises a radome 320 on the front that covers a plurality of electronics modules 321. For sake of clarity, the antenna elements and transceivers are not provided with dedicated reference signs. It is however understood, that the electronics modules 321 may each comprise at least one receiver, transmitter or transceiver and at least one antenna element. On the back of the active electronic arrangement 302 a heat spreader 322 is provided. The heat spreader 322 serves for leading away the heat that is generated during operation of the electronics modules 321 from the electronics modules 321. The heat spreader 322 may e.g. also comprise aluminum.

On the lower edge of the active electronic arrangement 302 a connector 323 is provided that serves for connecting the active electronic arrangement 302 to e.g. a baseband processor and/or a power supply.

When attaching the active electronic arrangement 302 to the cooling arrangement 301, for example screws may be used to fix the active electronic arrangement 302. It is understood, that respective holes and/or female threads may be provided in the cooling arrangement 301 and the active electronic arrangement 302.

It is further understood, that a heat transfer support element like a thermal pad may e.g. be provided between the cooling arrangement 301 and the active electronic arrangement 302.

Figure 4:
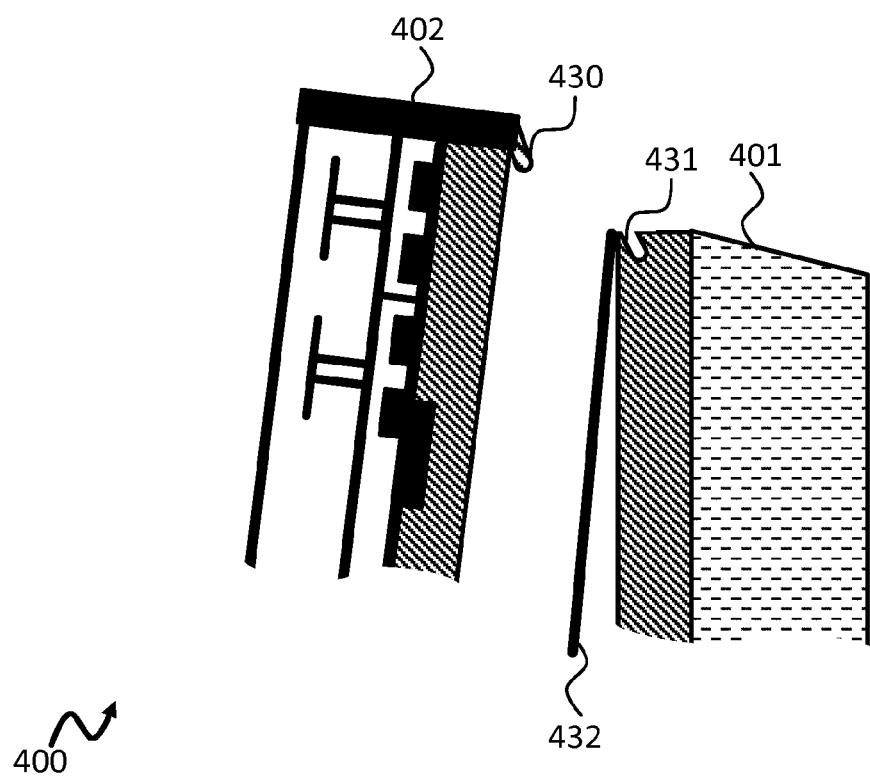
FIG. 4 shows a schematic diagram of another embodiment of an antenna system according to the present invention.

FIG. 4 shows a schematic diagram of another antenna system 400. The antenna system 400 is based on the antenna system 300. The antenna system 400 however comprises a hinge-like arrangement for mounting the active electronic arrangement 402 to the cooling arrangement 401.

On the upper back edge of the active electronic arrangement 402 a fixation element in the form of a hook 430 protrudes from the frame of the active electronic arrangement 402. The cooling arrangement 401 comprises a respective recess 431, into which the hook 430 may be introduced.

When mounting the active electronic arrangement 402 to the cooling arrangement 401, the hook 430 may be introduced into the recess 431. At this moment, the weight of the active electronic arrangement 402 will be sustained by the cooling arrangement 401. For final mounting the active electronic arrangement 402 may then be tilted toward the active electronic arrangement 402, which will happen anyways because of the gravitational force that pulls on the active electronic arrangement 402.

Therefore, mounting the active electronic arrangement 402 to the cooling arrangement 401 is greatly simplified, because the active electronic arrangement 402 will be self-retaining once the hook 430 is inserted into the recess 431. Optionally further fixation may be used. For example screws may be inserted at the lower end of the active electronic arrangement 402 to prevent the active electronic arrangement 402 from flipping or tilting upwards, e.g. because of wind.

Between the cooling arrangement 401 and the active electronic arrangement 402 a heat transfer support element 432, e.g. a thermal pad, is provided to improve the heat dissipation from the active electronic arrangement 402 via the cooling arrangement 401.

Figure 5:
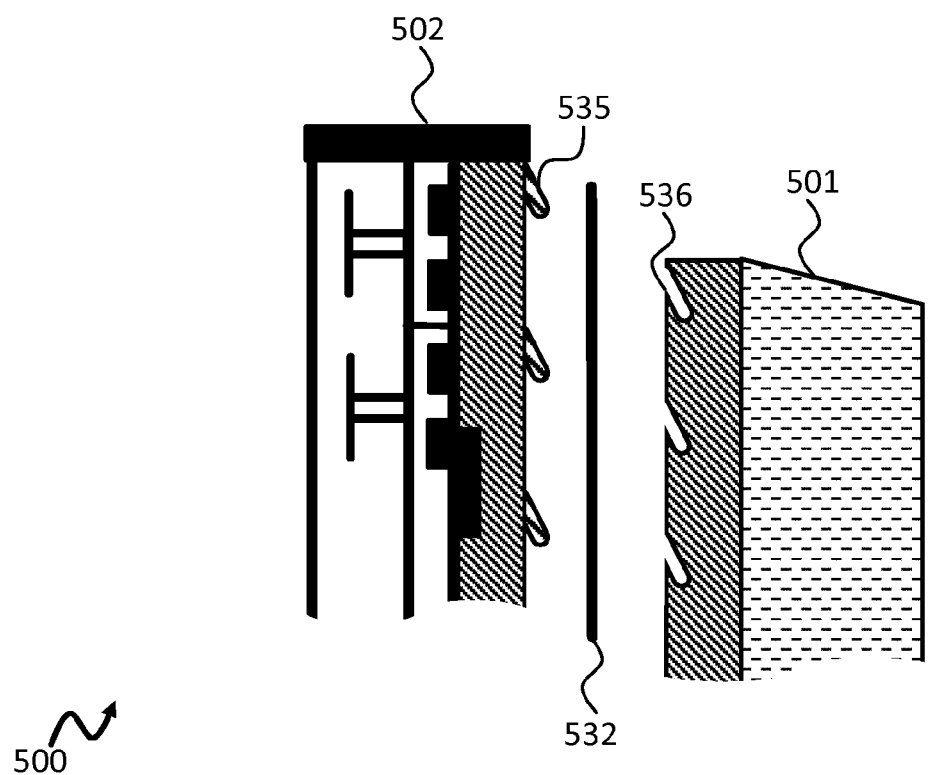
FIG. 5 shows a schematic diagram of another embodiment of an antenna system according to the present invention.

FIG. 5 shows a schematic diagram of another antenna system 500. The antenna system 500 is also based on the antenna system 300. However, in the antenna system 500 the active electronic arrangement 502 comprises three downward inclined protrusions 535, of which only the first is provided with a reference sign. It is understood, that any other number of such protrusions than three may also be provided. On the cooling arrangement 501 respective recesses 536 are provided.

With this arrangement, when mounting the active electronic arrangement 502 to the cooling arrangement 501, the technician only needs to engage the downward inclined protrusions 535 with the respective recesses 536. The downward inclined protrusions 535 will then slide into the recesses 536 as the active electronic arrangement 502 moves downward.

Again, it is understood, that any further fixation may be provided that prevents the active electronic arrangement 502 from sliding upwards and falling off the cooling arrangement 501.

Figure 6:
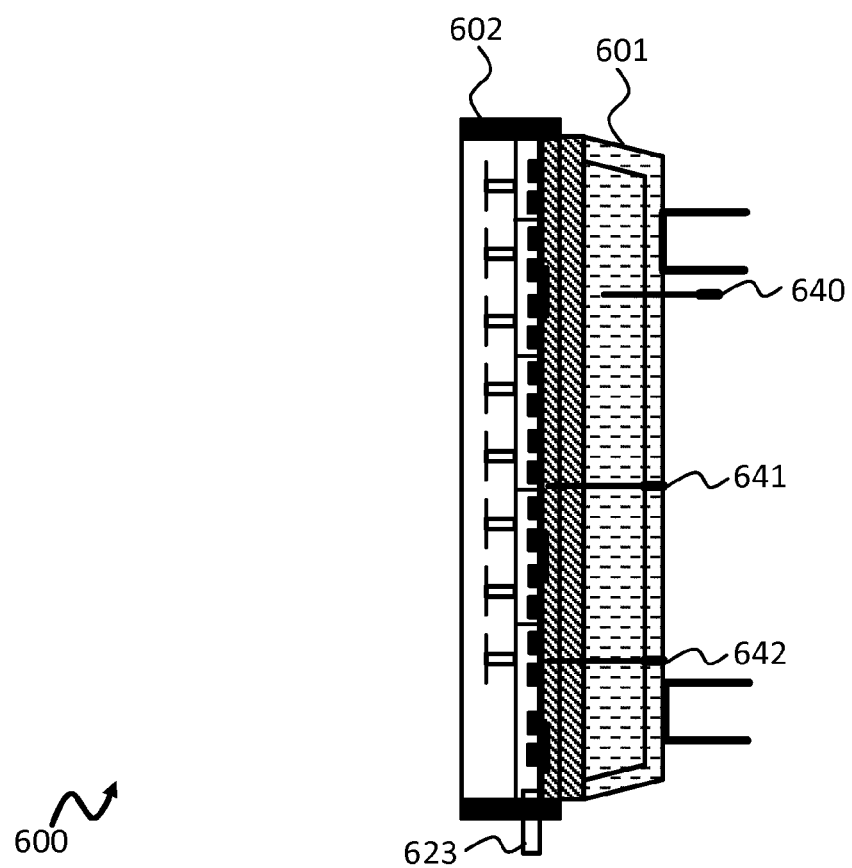
FIG. 6 shows a schematic diagram of another embodiment of an antenna system according to the present invention.

FIG. 6 shows a schematic diagram of another antenna system 600. The antenna system 600 may represent any one of the antenna systems 300, 400, 500 in the final mounted state. It can be seen, that screws 640, 641, 642 are provided that firmly hold the active electronic arrangement 602 in position on the cooling arrangement 601.

It is understood, that instead of screws 640, 641, 642 or in addition any other fixation like e.g. clamps, snap-fixes or the like may also be used.

For sake of clarity in the following description of the method based FIG. 7 the reference signs used above in the description of apparatus based FIGS. 1-6 will be maintained.

Figure 7:
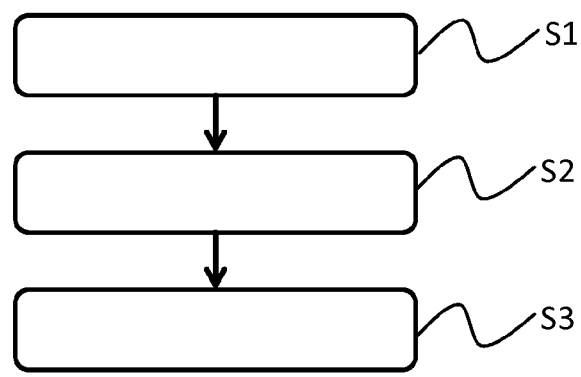
FIG. 7 shows a schematic flow diagram of an embodiment of a method according to the present invention.

FIG. 7 shows a schematic flow diagram of an embodiment of a method for manufacturing an antenna system 100, 200, 211, 300, 400, 500, 600 according to the present invention.

The method comprises forming S1 a cooling arrangement 101, 201, 212, 301, 401, 501, 601 configured to dissipate heat, and providing S2 an active electronic arrangement 102, 202, 213, 302, 402, 502, 602 that comprises a number of antenna elements 103, 104 and a number of receivers and/or transmitters for the antenna elements 103, 104. The active electronic arrangement 102, 202, 213, 302, 402, 502, 602 is provided such that it is releasably attachable to the cooling arrangement 101, 201, 212, 301, 401, 501, 601.

The cooling arrangement 101, 201, 212, 301, 401, 501, 601 may be provided with a plurality of heat dissipation fins 326 and/or an active cooling element and/or a liquid-based cooling element. It is understood, that the size and number of the fins 326 may be adapted to the operational environment of the antenna system 100, 200, 211, 300, 400, 500, 600.

The active electronic arrangement 102, 202, 213, 302, 402, 502, 602 may e.g. be provided such that it is mountable to the antenna pole 250, 350. As alternative, the cooling arrangement 101, 201, 212, 301, 401, 501, 601 may be formed such that is mountable to the antenna pole 250, 350.

The active electronic arrangement 102, 202, 213, 302, 402, 502, 602 may further be provided with a housing that comprises a radome 320 that covers the antenna elements 103, 104 at least in main transmission and reception direction, and that is attached to a heat spreader 322 that is coupled to the receivers and/or transmitters. The housing may further be provided with a fixation element 430 for releasably fixing the active electronic arrangement 102, 202, 213, 302, 402, 502, 602 on its back upper edge to the front upper edge of the cooling arrangement 101, 201, 212, 301, 401, 501, 601. Accordingly, the cooling arrangement 101, 201, 212, 301, 401, 501, 601 may be provided with a counterpart for the fixation element 430 on the front upper edge.

The housing may be provided with a number of downwards inclined protrusions 535, and the cooling arrangement 101, 201, 212, 301, 401, 501, 601 may be provided with corresponding recesses 536 that are configured to accommodate the downwards inclined protrusions 535. As alternative, the cooling arrangement 101, 201, 212, 301, 401, 501, 601 may be provided with a number of upward inclined protrusions, and the active electronic arrangement 102, 202, 213, 302, 402, 502, 602 may be provided with corresponding recesses that are configured to accommodate the upward inclined protrusions.

In addition, a heat transfer support element 432, 532 may be provided between the active electronic arrangement 102, 202, 213, 302, 402, 502, 602 and the cooling arrangement 101, 201, 212, 301, 401, 501, 601.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

The present invention provides an antenna system for attachment to an antenna pole, the antenna system comprising a cooling arrangement, and an active electronic arrangement that comprises a number of antenna elements and a number of receivers and/or transmitters for the antenna elements, wherein the active electronic arrangement is releasably attachable to the cooling arrangement. Further, the present invention provides a respective communication system and a method for manufacturing an antenna system.

LIST OF REFERENCE SIGNS 100, 200, 211, 300, 400, 500, 600 antenna system
101, 201, 212, 301, 401, 501, 601 cooling arrangement
102, 202, 213, 302, 402, 502, 602 active electronic arrangement
103, 104 antenna element
105, 106 transceiver
210 communication system
214 base band processor
320 radome
321 electronics module
322 heat spreader
323, 623 connector
325 contact surface
326 heat dissipation fin
327 clamp
430 fixation element
431 recess
432, 532 heat transfer support element
535 downwards inclined protrusion
536 recess
640, 641, 642 screw
250, 350 antenna pole

The invention claimed is:

1. Antenna system for attachment to an antenna pole, the antenna system comprising:
   a cooling arrangement; and
   an active electronic arrangement that comprises a number of antenna elements and a number of receivers and/or transmitters for the antenna elements,
   wherein the cooling arrangement comprises a contact surface for contacting the active electronic arrangement and wherein the active electronic arrangement is releasably attachable to the cooling arrangement via the contact surface.

2. The antenna system according to claim 1, wherein the cooling arrangement is configured for mounting to the antenna pole.

3. The antenna system claim 1, wherein the active electronic arrangement comprises a housing, wherein the housing comprises a radome that covers the antenna elements at least in main transmission and reception direction, and a plurality of electronics modules and a heat spreader that is coupled to the receivers and/or transmitters and that is configured to lead away the heat that is generated during operation of the electronics modules from the electronics modules.

4. The antenna system according to claim 3, wherein the housing comprises a fixation element for releasably fixing the active electronic arrangement on a back upper edge of the housing to a front upper edge of the cooling arrangement, wherein the cooling arrangement comprises a counterpart for the fixation element on the front upper edge.

5. The antenna system according to claim 3, wherein the housing comprises a number of downwards inclined protrusions, and wherein the cooling arrangement comprises corresponding recesses that are configured to accommodate the downwards inclined protrusions.

6. The antenna system according to any one of the preceding claims, wherein a heat transfer support element is provided between the active electronic arrangement and the cooling arrangement.

7. The antenna system according to any one of the preceding claims, wherein the cooling arrangement comprises a plurality of heat dissipation fins and/or an active cooling element and/or a liquid-based cooling elements.

8. The antenna system according to claim 3, wherein a heat transfer support element is provided between the active electronic arrangement and the cooling arrangement.

9. The antenna system according to claim 3, wherein the cooling arrangement comprises at least one or more selected from the group consisting of a plurality of heat dissipation fins, an active cooling element, and a liquid-based cooling elements.

10. The antenna system according to claim 3, wherein the cooling arrangement comprises a number of upward inclined protrusions, and wherein the active electronic arrangement comprises corresponding recesses that are configured to accommodate the upward inclined protrusions.

11. Communication system for wireless communication, the communication system comprising:
 a baseband processor, and
 a number of antenna systems according to claim 1, wherein the antenna systems are coupled to the baseband processor.

12. The antenna system according to claim 1, wherein the active electronic arrangement is configured for mounting to the antenna pole.

13. Method for manufacturing an antenna system, the method comprising:
 forming (S1) a cooling arrangement configured to dissipate heat, and
 providing (S2) an active electronic arrangement that comprises a number of antenna elements and a number of receivers and/or transmitters for the antenna elements, wherein the active electronic arrangement is provided such that it is releasably attachable to the cooling arrangement via a contact surface of the cooling arrangement for contacting the active electronic arrangement.

14. The method according to claim 13, wherein the cooling arrangement is formed such that is mountable to the antenna pole.

15. The method according to claim 13, wherein the active electronic arrangement is provided with a housing that comprises a radome that covers the antenna elements at least in main transmission and reception direction and a plurality of electronics modules, and that is attached to a heat spreader that is coupled to the receivers and/or transmitters and that is configured to lead away the heat that is generated during operation of the electronics modules from the electronics modules.

16. The method according to claim 15, wherein the housing is provided with a fixation element for releasably fixing the active electronic arrangement on a back upper edge of the housing to a front upper edge of the cooling arrangement, wherein the cooling arrangement is provided with a counterpart for the fixation element on the front upper edge.

17. The method according to claim 15, wherein the housing is provided with a number of downwards inclined protrusions, and wherein the cooling arrangement is provided with corresponding recesses that are configured to accommodate the downwards inclined protrusions; or
 wherein the cooling arrangement is provided with a number of upward inclined protrusions, and wherein the active electronic arrangement is provided with corresponding recesses that are configured to accommodate the upward inclined protrusions.

18. The method according to claim 13, wherein a heat transfer support element is provided between the active electronic arrangement and the cooling arrangement.

19. The method according to claim 13, wherein the cooling arrangement is provided with a plurality of heat dissipation fins and/or an active cooling element and/or a liquid-based cooling element.

20. The method according to claim 13, wherein the active electronic arrangement is provided such that it is mountable to the antenna pole.

* * * * *